United States Patent [19]

Fox

[11] Patent Number: 5,051,700
[45] Date of Patent: Sep. 24, 1991

[54] FEEDBACK CIRCUIT FOR NOISELESS DAMPING OF THE Q OF AN MRI RECEIVER COIL ANTENNA

[75] Inventor: Timothy R. Fox, Chicago, Ill.

[73] Assignee: Kabushiki Kaisha Toshiba, Kanagawa, Japan

[21] Appl. No.: 495,760

[22] Filed: Mar. 19, 1990

[51] Int. Cl.$^5$ .............................................. G01R 33/20
[52] U.S. Cl. ................................................... 324/322
[58] Field of Search .............. 324/300, 307, 309, 312, 324/314, 315, 318, 322; 128/653 A

[56] References Cited

U.S. PATENT DOCUMENTS

| | | | |
|---|---|---|---|
| 3,643,181 | 2/1972 | Stirrat et al. | 324/300 |
| 3,725,776 | 4/1973 | Petrinovic | 324/314 |
| 3,833,931 | 9/1974 | Bonori et al. | 324/312 |
| 3,921,060 | 11/1975 | Ekimovskikh et al. | 324/315 |
| 4,284,949 | 8/1981 | Vidrine et al. | 324/315 |
| 4,525,673 | 6/1985 | Berkowitz | 324/312 |
| 4,761,612 | 8/1988 | Holland et al. | 324/307 |
| 4,766,400 | 8/1988 | Fox | 324/309 |

OTHER PUBLICATIONS

D. I. Hoult, "Fast Recovery, High Sensitivity NMR Probe and Preamplifier for Low Frequencies," *Review of Scientific Instruments*, vol. 50, No. 2, Feb. 1979, 193-200.

*Primary Examiner*—Michael J. Tokar
*Attorney, Agent, or Firm*—Finnegan, Henderson, Farabow, Garrett, and Dunner

[57] ABSTRACT

A feedback circuit for a magnetic resonance imaging (MRI) or spectroscopy device comprising a resonant circuit, including an MRI receiver antenna, for generating output voltages in response to nuclear magnetic resonance magnetization signals received by the antenna; an amplifier, coupled to the resonant circuit, for amplifying the output voltages; a resistive feedback path from an output of the amplifier to the resonant circuit, the feedback path carrying a first feedback current; and a capacitive current divider having a tap point to which the first feedback path is connected, for diverting a first portion of the feedback current away from the resonant circuit and for directing a second portion of the first feedback current to the resonant circuit. The Q value of the feedback circuit may be decreased without degrading the signal to noise ratio in order to obtain a sufficient bandwidth for receiving the nuclear magnetic resonance magnetization signals.

12 Claims, 5 Drawing Sheets

FEEDBACK CIRCUIT FOR NOISELESS DAMPING OF THE Q OF AN MRI RECEIVER COIL ANTENNA

BACKGROUND OF THE INVENTION

I. Field of the Invention

The present invention relates to magnetic resonance imaging (MRI) and spectroscopy devices and more particularly, to a feedback circuit for a magnetic resonance imaging or spectroscopy device having an MRI receiver antenna, a resonant circuit for generating output voltages in response to nuclear magnetic resonance magnetization signals received by the MRI receiver antenna and an amplifier for amplifying the output voltages.

II. Description of the Related Art

In magnetic resonance imaging and magnetic resonance spectroscopy devices, time dependent nuclear magnetic resonance magnetization signals are detected and amplified to output a signal proportional to the time derivative of the magnetization signals. The signals proportional to the time derivative of the magnetization signals are processed to obtain a cross sectional or three-dimensional image of an object such as a patient or are analyzed to obtain the frequency spectrum of the magnetization signals to obtain information about the chemistry of the object. The nuclear magnetic resonance magnetization signals are weak, and accordingly, the signal to noise (S/N) ratio must be good.

A conventional circuit for a magnetic resonance imaging or spectroscopy device includes a resonant circuit and an amplifier. The resonant circuit includes an MRI receiver antenna which may be represented by an inductor having an inductance L, a capacitor having a capacitance $C_t$ and a parallel resistor with a resistance $R_p$ representing all the dissipations of the resonant circuit. The MRI receiver antenna L, capacitance $C_t$ and parallel resistance $R_p$ of a resonant circuit are connected in parallel. The resonant circuit generates output voltages in response to nuclear magnetic resonance magnetization signals received by the receiver antenna L. The amplifier amplifies the output voltages. The output voltages are generated by the nuclear magnetic resonance magnetization signals inducing an EMF in the receiver antenna.

The resonant circuit is an electronically resonant circuit wherein the reactive elements L and $C_t$ store energy. Energy is passed between the reactive elements at resonance while the parallel resistance $R_p$ dissipates energy. The quality factor, Q at the resonant frequency is represented as follows:

$$Q = \frac{R_p}{\omega_o L} = R_p \cdot \omega_o C_t \quad (1)$$

where $\omega_o = (L \cdot C_t)^{-\frac{1}{2}}$ is the natural resonant angular frequency.

where $\omega_0 = (L.C_t)^{-\frac{1}{2}}$ is the natural resonant angular frequency.

In such a conventional circuit, the voltage signal to noise ratio is proportional to the square root of Q. The Q value represents the number of oscillations before the energy is dissipated in the resonant circuit. In such a conventional resonant circuit, Q must be as high as possible to obtain the best signal to noise ratio. In order to make Q as high as possible, it is desired to keep $R_p$ as high as possible. With good design, a Q of 250 or so is possible.

The conventional circuit as described above is associated with a problem that the bandwidth of the resonant circuit is given by:

$$BW = f_0/Q \quad (2)$$

where $f_0$ is the center frequency; and BW is the full width of the resonant peak at $-3$ dB.

Therefore, the bandwidth is inversely proportional to Q. There is a phase shift associated with the amplitude variations of the signal from the circuit. At the $-3$ dB frequencies, there is a phase shift of + or $-45°$ with respect to the phase of the signal at the center frequency. Accordingly, there can be a substantial error, especially in phase shift, over the passband of the circuit. To reduce the amplitude and phase errors, it is desirable to increase the bandwidth of the MRI receiving antenna resonant circuit. Thus, it is desirable to decrease the Q without sacrificing the signal to noise ratio.

In quadrature antenna circuits, where there are two normally orthogonal coils with a small coupling between them, a high Q of conventional circuits magnifies the small coupling between the normally orthogonal coils. Reducing the Q greatly simplifies the coupling and polarization problems associated with quadrature imaging. Accordingly, it is desirable to decrease the Q. In circuits employing either quadrature or surface receiving coils, there is a problem with coupling between the transmitter and receiver resonant circuits. Reducing the Q of the receiver resonant circuit makes decoupling easier. In circuits with multiple receiver coils that are not orthogonal, there is a problem with coupling between the multiple surface receiving coils. Again, reducing the Q of the resonant circuits makes decoupling easier. Thus, it is desirable to reduce the Q of a resonant circuit without degrading the signal to noise ratio.

A conventional method of resistive damping, wherein a damping resistance $R_d$ is placed in parallel with the resonant circuit including the parallel resistance $R_p$, decreases the Q linearly with the value of $R_p$ but also decreases the signal to noise ratio as a function of the square root of Q.

A Figure of Merit (FOM) comparing the noise resistance $R_n$ to the damping resistance $R_d$ may be defined as follows:

$$FOM = \frac{R_n}{R_d}. \quad (3)$$

Conventional resistive damping results in a Figure of Merit of 1 since the same resistor provides the resistances $R_n$ and $R_d$.

Resistive damping:

$$FOM = \frac{R_n}{R_d} = \frac{R_d}{R_d} = 1. \quad (4)$$

Figure 1:
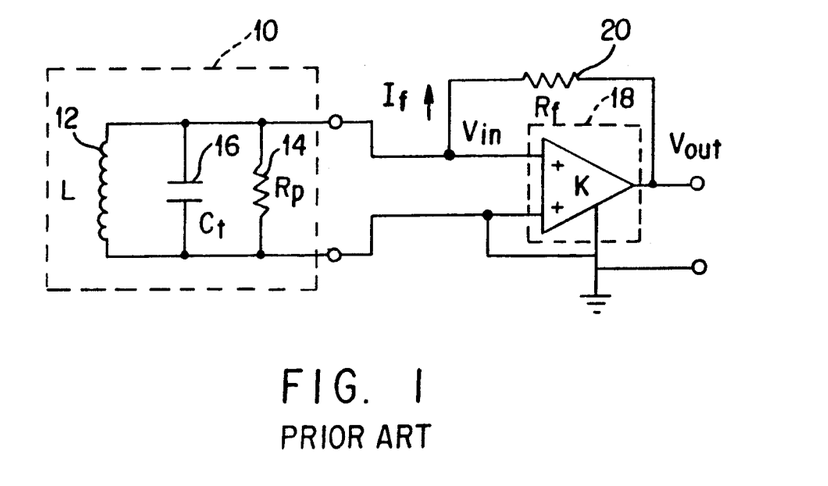
FIG. 1 is a circuit diagram of a conventional feedback circuit for a magnetic resonance imaging or spectroscopy device.

FIG. 1 is a circuit diagram of a conventional feedback circuit for a magnetic resonance imaging or spectroscopy device. The circuit includes a resonant circuit 10, amplifier 18 and a resistive feedback path 20 including a feedback resistor $R_f$. The resonant circuit 10 includes an MRI receiver antenna 12 illustrated as an inductance L, a capacitor 16 having a capacitance $C_t$ and a parallel resistor 14 with a resistance $R_p$. The MRI receiver antenna 12, capacitor 16 and parallel resistor 14 are connected in parallel.

The resonant circuit 10 generates output voltages, the voltages across the MRI receiver antenna 12, capacitor 16 and parallel resistor 14, in response to nuclear magnetic resonance magnetization signals received by the MRI receiver antenna 12. The amplifier 18 is coupled across the resonant circuit and amplifies the output voltages. The resistive feedback path 20 is provided from an output of the amplifier 18 to the resonant circuit 10 and carries a feedback current $I_f$. The amplifier 18 has a negative (inverting) voltage gain of $-K$ and the feedback resistor $R_f$ makes a negative feedback path from the output of the amplifier 18 to the input of the amplifier 18.

For the purpose of analyzing the damping resistance, an effective damping resistance $R_d$ is considered to be added in parallel with the parallel resistance $R_p$ and is represented as follows:

(FIG. 1)

$$R_d = R_f/(K+1). \tag{5}$$

For the purpose of analyzing noise, the noise resistance considered to be added in parallel with the parallel resistor $R_p$ is the value $R_n$.

(FIG. 1)

$$R_n = R_f \tag{6}$$

Accordingly, the Figure of Merit for the conventional feedback circuit of FIG. 1 is:

(FIG. 1)

$$FOM = \frac{R_n}{R_d} = \frac{R_f}{R_f/(K+1)} = K + 1. \tag{7}$$

Since K is greater than 1, the Figure of Merit for the conventional feedback circuit of FIG. 1 is improved over the Figure of Merit for resistive damping given by equation (4). Nevertheless, it is desired to improve the ratio between the effective noise resistance of the feedback circuit and the effective damping resistance for the resonant circuit even further in order to further decrease the Q without degrading the signal to noise ratio.

In the circuit of FIG. 1, a resistor of a high value, for example, 1 megaohm, is required for the feedback resistor $R_f$. A resistor of a high value is associated with serious problems of stray and internal capacitance which can cause phase shifts in the feedback and a substantial reduction in the high-frequency resistance of the feedback path. Therefore, it is difficult to obtain a resistor of a high resistance value at high frequencies. In addition, it is desirable to decrease the Q to make decoupling easier for quadrature circuits, and for facilitating the decoupling of quadrature and surface receiving coils in transmitter and receiver resonant circuits as well as multiple surface receiving coils as discussed above.

Figure 2:
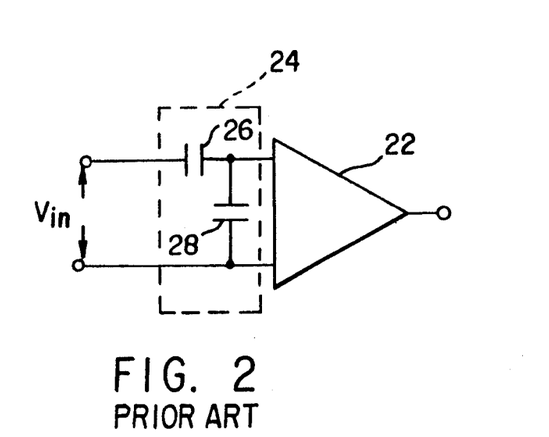
FIG. 2 is a circuit diagram of a conventional amplifier coupled to a capacitive network.

FIG. 2 is a circuit diagram of a conventional amplifier 22 coupled to a capacitive network 24. The capacitive network 24 includes capacitance 26 and capacitance 28. Capacitance 28 is coupled across the inputs of the amplifier 22. Capacitance 26 is connected in series with capacitance 28. The capacitive network 24 supplies a fraction of the input voltage $V_{in}$ to the input of the amplifier 22.

SUMMARY OF THE INVENTION

It is, accordingly, an object of the present invention to provide a feedback circuit for a magnetic resonance imaging or spectroscopy device that permits decreasing the Q of a resonant circuit including an MRI receiver antenna without sacrificing the signal to noise ratio.

Additional objectives and advantages of the invention will be set forth in part in the description which follows, and in part will be apparent from the description or may be learned by practice of the invention.

To achieve the foregoing objectives and in accordance with the purposes of the invention as embodied and broadly described herein, there is provided a feedback circuit for a magnetic resonance imaging (MRI) or spectroscopy device comprising resonant circuit means, including an MRI receiver antenna, for generating output voltages in response to nuclear magnetic resonance magnetization signals received by the antenna; amplifying means, coupled to the resonant circuit means, for amplifying the output voltages; means for providing a resistive feedback path from an output of the amplifying means to the resonant circuit means, the feedback path carrying first feedback current; and capacitive current divider means having a tap point to which the first feedback path is connected, for diverting a first portion of the first feedback current away from the resonant circuit means and for directing a second portion of the first feedback current to the resonant circuit means.

In accordance with the present invention, the amplifying means may include a second output opposite in polarity to the output of the amplifying means, and the circuit may further comprise second means for providing a second resistive feedback path from the second output of the amplifying means to the resonant circuit means, the second feedback path carrying second feedback current approximately 180° different in phase from the first feedback current; and the capacitive current divider means may further include a second tap point, the second feedback path being connected to the second tap point, for diverting a first portion of the second feedback current away from the resonant circuit means and for directing a second portion of the second feedback current to the resonant circuit means.

In accordance with the present invention, the feedback circuit may further comprise second amplifying means, coupled to the resonant circuit means, for amplifying at least a fraction of the output voltages; second means for providing a second feedback path from an output of the second amplifying means to the resonant circuit means, the second feedback path carrying second feedback current; second capacitive current divider means having a tap point to which the second feedback path is connected, for diverting a first portion of the second feedback current away from the resonant circuit means and for directing a second portion of the second feedback current to the resonant circuit means; and differential amplifier means, connected to the outputs of the amplifying means and the second amplifying means, for obtaining a signal representing the difference of the outputs of the amplifying means and the second amplifying means.

DESCRIPTION OF THE PREFERRED EMBODIMENT

Reference will now be made in detail to the present preferred embodiment of the subject invention and illustrated in the accompanying drawings.

Figure 3:
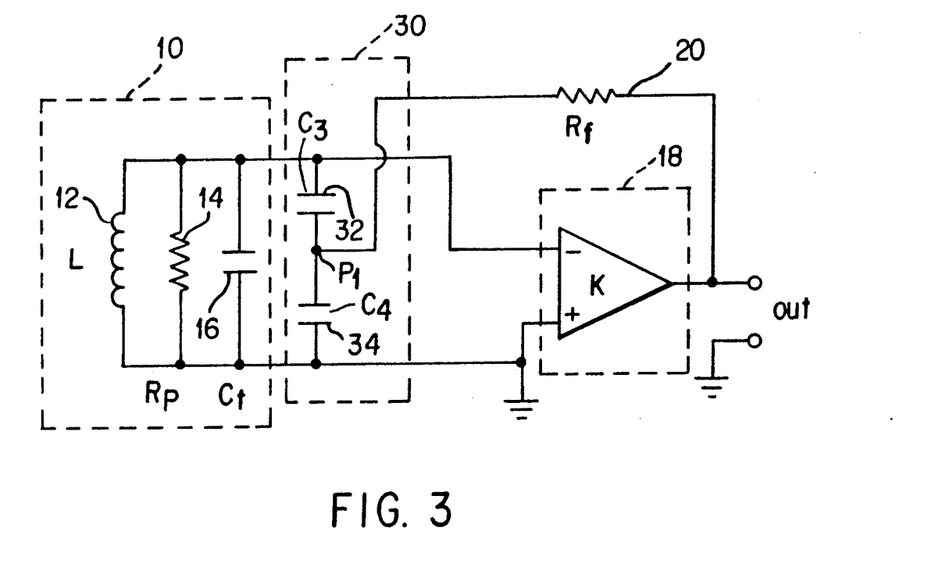
FIG. 3 is a circuit diagram of a feedback circuit for a magnetic resonance imaging or spectroscopy device in accordance with the present invention.

FIG. 3 is a circuit diagram of a feedback circuit for a magnetic resonance imaging or spectroscopy device in accordance with the present invention. As illustratively shown in the drawings a resonant circuit 10 is provided which includes an MRI receiver antenna 12 illustrated as inductance L, a parallel resistor 14 having resistance $R_p$, and a capacitor 16 having a capacitance $C_t$. The MRI receiver antenna 12, the parallel resistor 14 and the capacitor 16 are connected in parallel. The resonant circuit 10 generates output voltages across the MRI receiver antenna 12, the parallel resistor 14 and the capacitor 16 in response to nuclear magnetic resonance magnetization signals received by the antenna 12.

As shown in the drawing, an amplifier 18 is provided which is connected across the resonant circuit 10. The amplifier 18 has a negative (inverting) voltage gain of $-K$. The amplifier 18 has a positive input and a negative input. The output voltages generated by the resonant circuit 10 are amplified by the amplifier 18. A resistive feedback path 20 including a feedback resistor $R_f$ is provided which provides a resistive feedback path from an output of the amplifier 18 to the resonant circuit 10. The feedback path 20 carries a first feedback current.

A current divider 30 is provided which comprises capacitor 32 having capacitance $C_3$ and capacitor 34 having capacitance $C_4$ connected in series across the resonant circuit 10. The current divider has a tap point $P_1$ to which the feedback path 20 is connected. The current divider 30 diverts a first portion of the first feedback current away from the resonant circuit 10 through the capacitor 34 and to ground. In addition, the current divider 30 directs a second portion of the first feedback current to the resonant circuit 10 through the capacitor 32. The total circuit including the MRI receiver antenna 12, capacitor 16 with capacitance $C_t$, capacitor 32 with capacitance $C_3$, and capacitor 34 with capacitance $C_4$ resonates at the resonant angular frequency $\omega_0$.

An effective "turns ratio" $n_f$ is given by:

(FIG. 3)

$$n_f = (C_3 + C_4)/C_3 > 1. \tag{8}$$

In a preferred embodiment the capacitance $C_4$ is greater than the capacitance $C_3$ and the majority of the first feedback current is diverted from the resonant circuit 10 and a minority of the first feedback current is directed to the resonant circuit 10.

The current divider 30 decreases the feedback current through the feedback resistor $R_f$ by a factor $n_f$. Therefore, the effective value of the feedback resistor $R_f$ for damping the resonance, designated as the effective damping resistance $R_d$, is given by:

(FIG. 3)

$$R_d = \frac{n_f \cdot R_f}{(K + 1)}. \tag{9}$$

Figure 5:
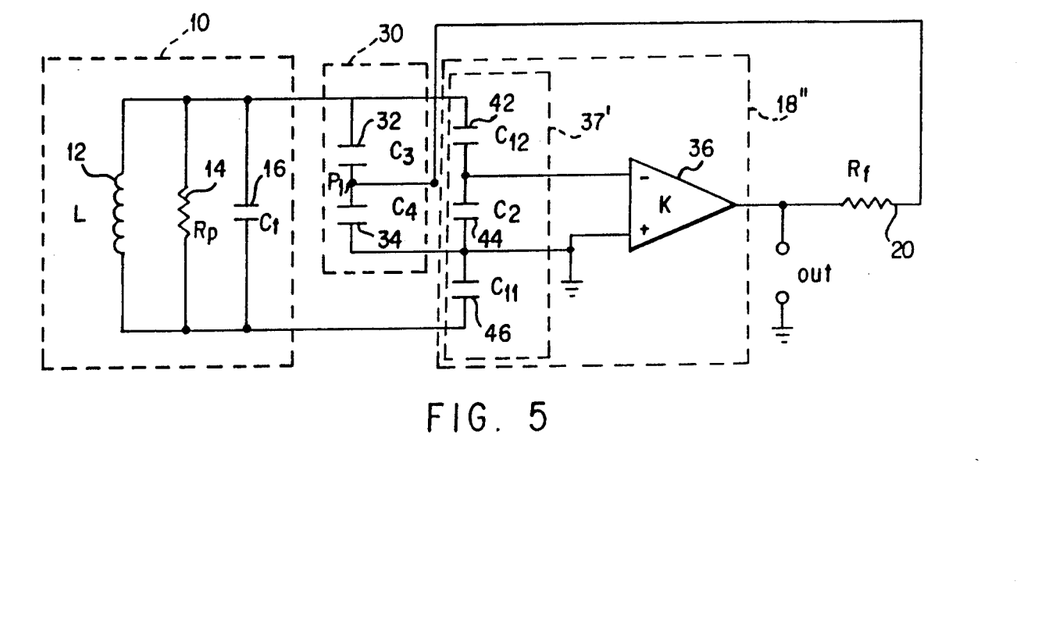
FIG. 5 is a circuit diagram of a feedback circuit for a magnetic resonance imaging or spectroscopy device in accordance with a third embodiment of the present invention.

This value for the effective damping resistance is $n_f$ times higher than the damping resistance of the conventional circuit of FIG. 5 as given by equation (5). Accordingly, for a given value of $R_d$, a smaller feedback resistor $R_f$ can be used in accordance with the invention. Accordingly, problems associated with stray capacitances within and around the feedback resistor $R_f$ changing the impedance from resistive to capacitive are solved by the present invention.

Not only does the invention permit use of a smaller feedback resistor $R_f$, but the invention also permits an improved ratio between the effective noise resistance of the feedback circuit and the effective damping resistance. For the purpose of analyzing noise, the feedback resistor $R_f$ is transformed into an effective noise resistance $R_n$ in parallel with the MRI receiver antenna 12 illustrated by the inductance L. The total resistance $R_t$ across the resonant circuit is given by:

$$R_t = \frac{R_p R_n}{R_n + R_p}. \tag{10}$$

For a value of $R_n$ much greater than $R_p$, the total resistance $R_t$ approximates the value of $R_p$ and the effective noise resistance $R_n$ has no real effect on noise.

In accordance with the feedback circuit of FIG. 3, the effective noise resistance $R_n$ is given by:

(FIG. 3)

$$R_n = n_f^2 \cdot R_f. \tag{11}$$

For a given value of $R_f$, the effective noise resistance in accordance with the feedback circuit of FIG. 3 is $n_f^2$ times that for the conventional circuit of FIG. 1 as given by equation (6). The Figure of Merit defined by the ratio of the effective noise resistance to the effective damping resistance for the feedback circuit of FIG. 3 is given as follows:

(FIG. 3)

$$FOM = \frac{R_n}{R_d} = \frac{n_f^2 \cdot R_f(K+1)}{n_f \cdot R_f} = n_f(K+1). \quad (12)$$

Accordingly, the Figure of Merit for the feedback circuit of FIG. 3 is improved by a factor of $n_f$ over the Figure of Merit for the conventional circuit of FIG. 1 as given by equation (7). Accordingly, the invention as embodied by way of example and not limitation by the feedback circuit of FIG. 3, permits decreasing the Q further than permitted by the conventional circuit of FIG. 1 without sacrificing the signal to noise ratio.

Figure 4:
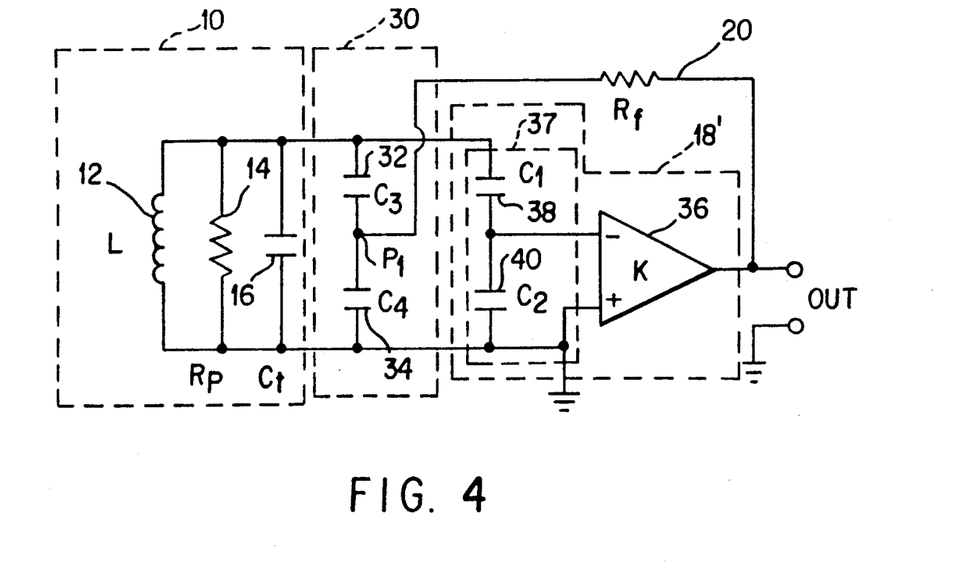
FIG. 4 is a circuit diagram of a feedback circuit for a magnetic resonance imaging or spectroscopy device in accordance with a second embodiment of the present invention.

FIG. 4 is a circuit diagram of a feedback circuit for a magnetic resonance imaging or spectroscopy device in accordance with a second embodiment of the invention. Components of the feedback circuit of FIG. 4 which are similar to the components 1 of FIG. 3 are identically numbered. An amplifier 18′ is provided which includes a voltage amplifier 36 and a capacitive network 37 including capacitor 38 having capacitance $C_1$ and capacitor 40 having capacitance $C_2$. The voltage amplifier 36 has a positive input and a negative input. The positive input is grounded. Capacitor 40 is connected between the positive and negative inputs of voltage amplifier 36. Capacitor 38 is connected between the negative input of voltage amplifier 36 and the resonant circuit 10. The capacitive network 37 supplies a fraction of the output voltages generated by the resonant circuit 10 to the input of the voltage amplifier 36.

An effective "turns ratio" n due to the capacitive network 37 is given by:

$$n = (C_1 + C_2)/C_1 > 1. \quad (13)$$

An effective voltage gain of the amplifier 18′ is given by:

$$K' = K/n. \quad (14)$$

The effective damping resistance is given by:

(FIG. 4)

$$R_d = \frac{n_f \cdot R_f}{(K'+1)}. \quad (15)$$

The effective noise resistance is given by equation (11) and the Figure of Merit for the circuit of FIG. 4 is given by:

(FIG. 4)

$$FOM = \frac{R_n}{R_d} = \frac{n_f^2 \cdot R_f(K'+1)}{n_f \cdot R_f} = n_f(K'+1). \quad (16)$$

The total circuit including capacitor 16 having capacitance $C_t$, capacitor 32 having capacitance $C_3$, capacitor 34 having capacitance $C_4$, capacitor 38 having capacitance $C_1$, capacitor 40 having capacitance $C_2$ and the MRI receiver antenna 12 having inductance L resonates at the resonant frequency $\omega_0$.

FIG. 5 is a circuit diagram of a feedback circuit for a magnetic resonance imaging or spectroscopy device in accordance with a third embodiment of the invention. The components of the feedback circuit of FIG. 5 that are similar to the components of FIG. 4 are identically numbered. In the feedback circuit of FIG. 5, the capacitive network 37′ includes capacitor 42 having capacitance $C_{12}$, capacitor 44 having capacitance $C_2$, and capacitor 46 having capacitance $C_{11}$. The capacitors 42, 44 and 46 are connected in series. Capacitor 44 is connected across the positive and negative inputs of the voltage amplifier 36. Capacitor 42 is connected between the negative input of the voltage amplifier 36 and the resonant circuit 10. Capacitor 46 is connected between the positive input of the voltage amplifier 36 which is grounded and the resonant circuit 10. The capacitive network 37′ is coupled across the resonant circuit 10.

The series combination of the capacitances $C_{12}$ of capacitor 42 and $C_2$ of capacitor 44 equals the capacitance $C_{11}$ of capacitor 46. The MRI receiver antenna 12 has two ends, the voltage at each end being approximately equal in magnitude and opposite in potential due to capacitors 42, 44 and 46. Accordingly, the feedback circuit of FIG. 5 is approximately balanced with respect to ground. The total circuit including capacitor 16 with capacitance $C_t$, capacitor 32 with capacitance $C_3$, capacitor 34 with capacitance $C_4$, capacitor 42 with capacitance $C_{12}$, capacitor 44 with capacitance $C_2$, capacitor 46 with capacitance $C_{11}$, and the MRI receiver antenna 12 with inductance L resonates at the resonant frequency $\omega_0$.

In the feedback circuit of FIG. 5, the "turns ratio" n due to the capacitive network 37′ is given by:

(FIG. 5)

$$n = \frac{C_1 + C_2}{C_1} > 2; \text{ where} \quad (17)$$

$$C_1 = \frac{C_{11} \cdot C_{12}}{C_{11} + C_{12}}.$$

The "turns ratio" $n_f$ due to the current divider 30 is given by:

(FIG. 5)

$$n_f = 2 \cdot \frac{C_3 + C_4}{C_3} > 2. \quad (18)$$

Knowing the "turns ratios" given by equations (17) and (18), the Figure of Merit may be obtained by equations (11), (14), (15) and (16).

Figure 6:
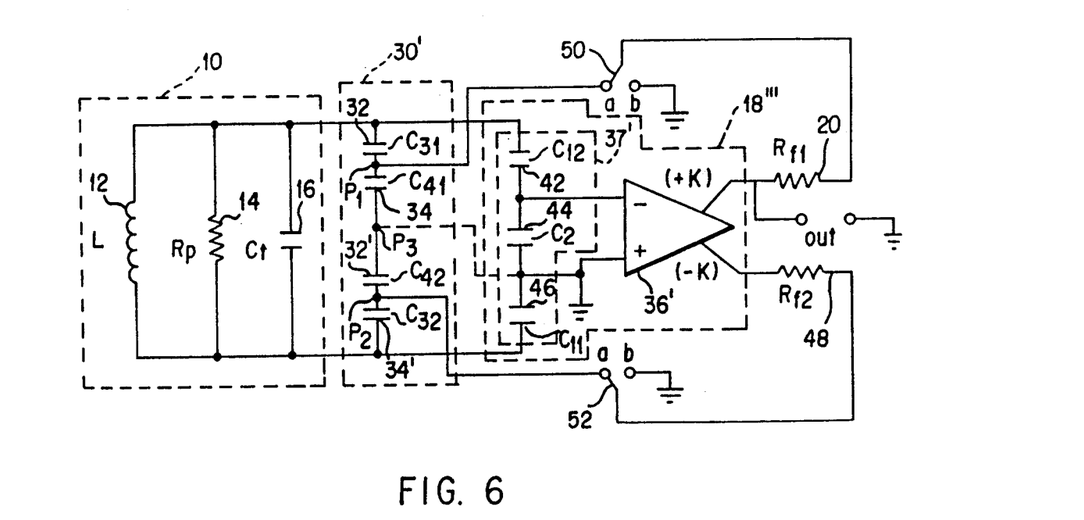
FIG. 6 is a circuit diagram of a feedback circuit for a magnetic resonance imaging or spectroscopy device in accordance with a fourth embodiment of the present invention.

FIG. 6 is a circuit diagram of a feedback circuit for a magnetic resonance imaging or spectroscopy device in accordance with a fourth embodiment of the invention. Components of the feedback circuit of FIG. 6 that are similar to the components of FIG. 5 are identically numbered. In FIG. 6, the voltage amplifier 36′ of amplifier 18′″ has a second output opposite in polarity to the first output. The feedback circuit includes a second resistive feedback path which carries a second feedback current approximately 180° different in phase from the first feedback current. As illustratively shown, a resistive feedback path 48 including a feedback resistor $R_{f2}$ is provided which provides the second resistive feedback path.

As further shown in FIG. 6, a current divider 30′ is provided which includes capacitor 32 with capacitance $C_{31}$, capacitor 34 with capacitance $C_{41}$, capacitor 32′ with capacitance $C_{42}$, and capacitor 34′ with capacitance $C_{32}$. The capacitors 32, 34, 32′ and 34′ are connected in series across the resonant circuit 10.

The current divider 30' includes a tap point $P_1$ between the capacitors 32 and 34 and a second tap point $P_2$ between capacitors 32' and 34'. The first feedback path 20 including a first feedback resistor $R_{f1}$ is connected to the tap point $P_1$. The second feedback path 48 with second feedback resistor $R_{f2}$ is connected to the tap point $P_2$. A third tap point $P_3$ between the capacitors 34 and 32' may be connected to ground. However the connection to ground is optional. A first portion of the second feedback current in the second feedback path 48 is diverted away from the resonant circuit 10 through capacitor 32' and a second portion of the second feedback current is directed to the resonant circuit 10 through capacitor 34'. The capacitance $C_{42}$ of capacitor 32' is greater than the capacitance $C_{32}$ of capacitor 34'. The total circuit including capacitor 16 with capacitance $C_t$, capacitor 32 with capacitance $C_{31}$, capacitor 34 with capacitance $C_{41}$, capacitor 32' with capacitance $C_{42}$, capacitor 34, with capacitance $C_{32}$, capacitor 42 with capacitance $C_{12}$, capacitor 44 with capacitance $C_2$, capacitor 46 with capacitance $C_{11}$, and the MRI receiver antenna 12 with inductance L resonates at the angular frequency $\omega_0$.

The effective "turns ratio" $n_f$ is given by:

$$n_f = \frac{C_{31} + C_{41}}{C_{31}} = \frac{C_{32} + C_{42}}{C_{32}}. \quad (19)$$

The effective damping resistance is given by equation (15) and the effective noise resistance is given by:

$$R_n = 2 \cdot (n_f^2) \cdot R_f. \quad (20)$$

This results in an improved Figure of Merit given by:

$$FOM = \frac{R_n}{R_d} = 2 \cdot n_f \cdot (K' + 1). \quad (21)$$

To maintain circuit balance, $$R_{f1} = R_{f2} = R_f \quad (22)$$

The first resistive feedback path 20 includes first switch 50 for selectively interrupting the first resistive feedback path. Further, the second resistive feedback path 48 includes a second switch 52 for selectively interrupting the second resistive feedback path. Accordingly, the first resistive feedback path 20 may be interrupted, the second resistive feedback path 48 may be interrupted or neither resistive feedback may be interrupted.

Figure 7:
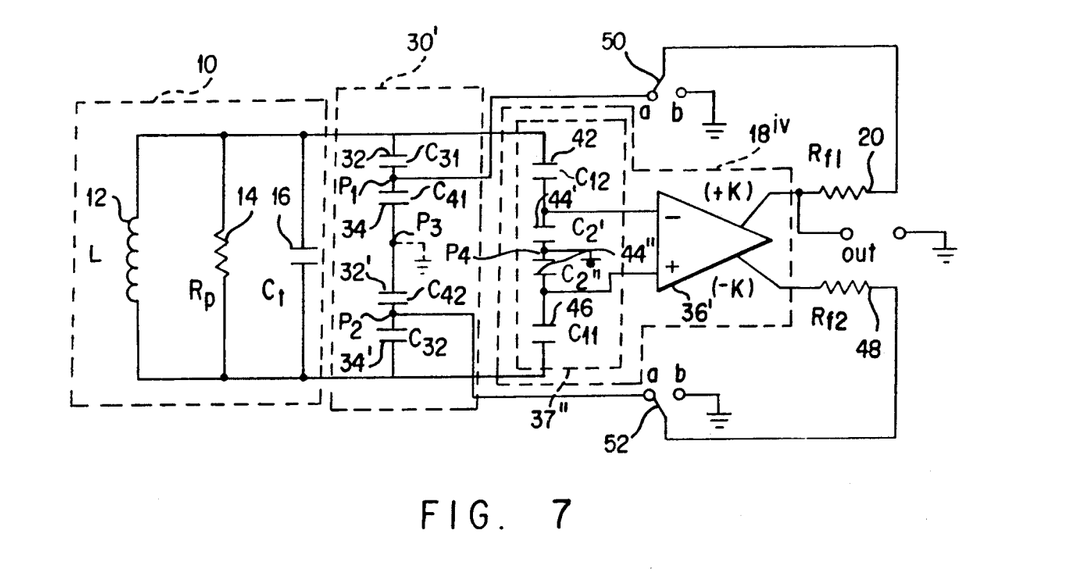
FIG. 7 is a circuit diagram of a feedback circuit for a magnetic resonance imaging or spectroscopy device in accordance with a fifth embodiment of the present invention.

FIG. 7 is a circuit diagram of a feedback circuit for a magnetic resonance imaging or spectroscopy device in accordance with a fifth embodiment of the invention. Components similar to those of FIG. 6 are identically numbered. In FIG. 7, within the capacitive network 37", the capacitor 44 with capacitance $C_2$ of FIG. 6 has been replaced by a series combination of capacitors 44' and 44" having capacitances $C_2'$ and $C_2''$, respectively. There is a tap point $P_4$ between the capacitors 44' and 44" which may be grounded. In FIG. 7, either the tap point $P_3$ or the tap point $P_4$ may be grounded, but at least one of the tap points $P_3$ and $P_4$ must be grounded. The capacitances $C_2'$ and $C_2''$ are equal and $C_2'+C_{241}$ equals the capacitance $C_2$ of FIG. 6. Due to the capacitances $C_2'$ and $C_2''$, the voltage amplifier 36' of amplifier 18$^{iv}$ has a differential input and a balanced output with respect to ground. Accordingly, the voltage amplifier 36' is a double input, double output voltage amplifier.

Figure 8:
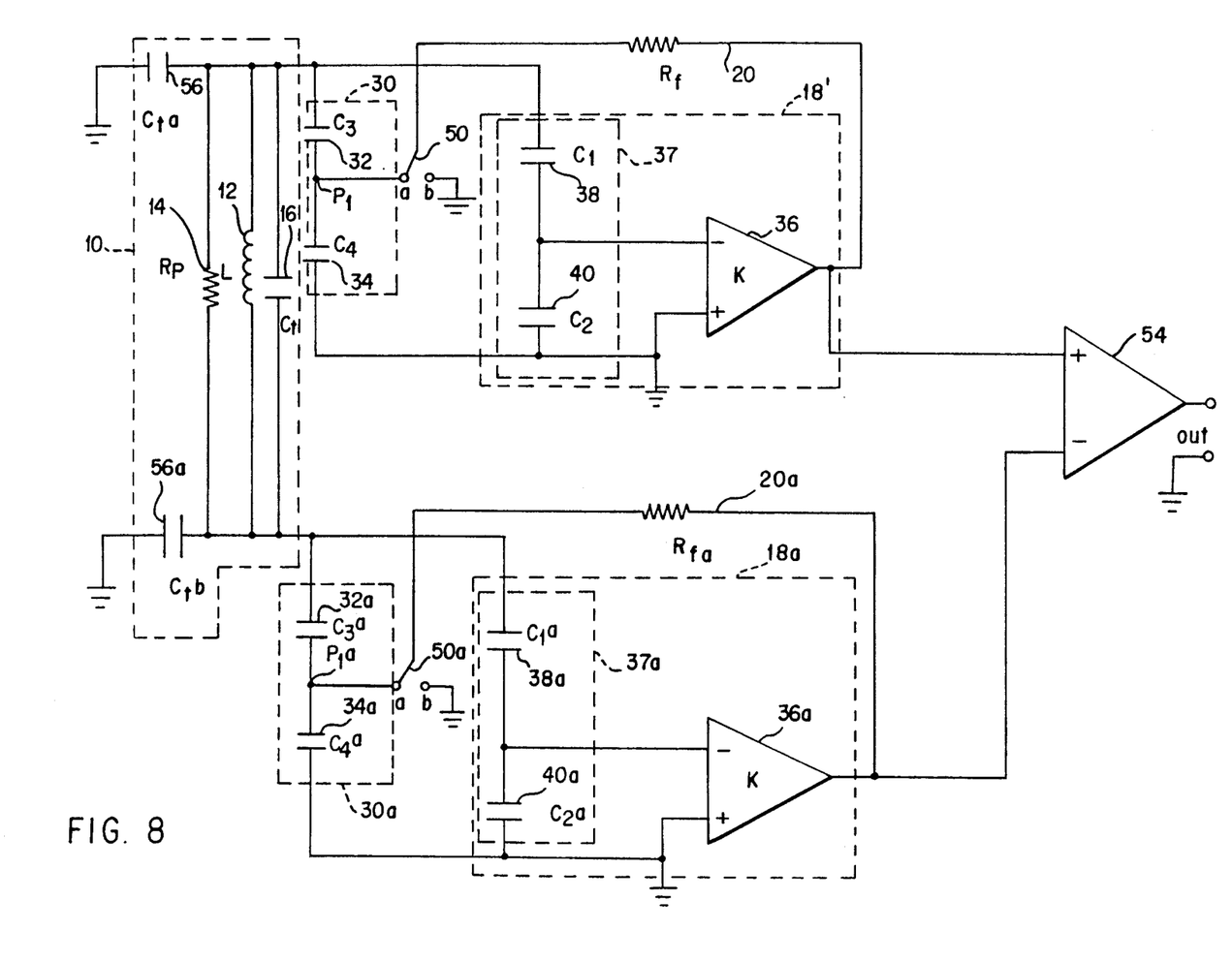
FIG. 8 is a circuit diagram of a feedback circuit for a magnetic resonance imaging or spectroscopy device in accordance with a sixth embodiment of the present invention.

FIG. 8 is a circuit diagram of a feedback circuit for a magnetic resonance imaging or spectroscopy device in accordance with a sixth embodiment of the invention. Components similar to those of FIG. 3 are identically numbered. In the feedback circuit of FIG. 8, the resonant circuit 10 includes capacitors 56 and 56a having capacitances $C_t a$ and $C_t b$. Capacitor 56 is connected between one end of the MRI receiver antenna 12 and ground and capacitor 56a is connected between the other end of the MRI receiver antenna 12 and ground. As illustrated in FIG. 8, the current divider 30 is connected between one end of the MRI receiver antenna 12 and ground.

As illustratively shown in FIG. 8 by way of example, amplifier 18a is for amplifying at least a fraction of the output voltages of the resonant circuit 10. The feedback circuit of FIG. 8 further includes a second feedback path 20a including a second feedback resistor $R_{fa}$ from an output of the second amplifier 18a to the resonant circuit 10. In addition, the feedback circuit of FIG. 8 includes current divider 30a having a tap point $P_{1a}$ to which the second feedback path 20a is connected. The current divider 30a is connected between a second end of the MRI receiver antenna 12 and ground. The current divider 30a includes capacitor 32a with capacitance $C_{3a}$ in series with capacitor 34a having capacitance $C_{4a}$. The tap point $P_{1a}$ is between capacitor 32a and capacitor 34a.

Capacitive network 37a includes capacitor 38a having capacitance $C_{1a}$ and capacitor 40a having capacitance $C_{2a}$. Capacitors 38a and 40a are connected in series across the second current divider 30a. Capacitor 40a is connected across the negative and positive inputs of the voltage amplifier 36a. Capacitor 38a is connected between a negative input of the voltage amplifier 36a and the second end of the MRI receiver antenna 12.

As illustratively shown in FIG. 8 by way of example, a differential amplifier 54 is connected to the outputs of amplifier 18' and amplifier 18a and obtains a signal representing the difference of the outputs of the amplifier 18' and the second amplifier 18a.

As illustrated in FIG. 8, first switch 50 is provided in the first resistive feedback path 20 and second switch 50a is provided in the second resistive feedback path 20a.

Additional advantages and modifications will readily occur to those skilled in the art. The invention in its broader aspects is not, therefore, limited to the specific details, representative methods and illustrative examples shown and described. Accordingly, departures may be made from such details without departing from the spirit or scope of Applicant's general inventive concept.

I claim:

1. A feedback circuit for a magnetic resonance imaging (MRI) or spectroscopy device comprising:
    resonant circuit means, including an MRI receiver antenna, for generating output voltages in response to nuclear magnetic resonance magnetization signals received by said antenna;
    amplifying means, coupled to said resonant circuit means, for amplifying said output voltages;
    means for providing a resistive feedback path from an output of said amplifying means to said resonant circuit means, said feedback path carrying first feedback current; and capacitive current divider means having a tap point to which said first feedback path is connected, for diverting a first portion of said first feedback current away from said resonant circuit means and for directing a second portion of said first feedback current to said resonant circuit means.

2. A feedback circuit according to claim 1, wherein said capacitive current divider means includes a plurality of capacitances for diverting the majority of said first feedback current away from said resonant circuit means for directing a minority of said first feedback current to said resonant circuit means.

3. A feedback circuit according to claim 1, wherein said amplifying means includes a voltage amplifier and a capacitive network.

4. A feedback circuit according to claim 3, wherein said capacitive network includes capacitor means for supplying a fraction of the output voltages generated by said resonant circuit means to the input of said voltage amplifier.

5. A feedback circuit according to claim 1, wherein said capacitive current divider means comprises:

a first capacitance which diverts the first portion of said first feedback current away from said resonant circuit connected between said feedback path and ground, and a second capacitance which directs the second portion of said first feedback current to said resonant circuit means connected between said feedback path and said resonant circuit means.

6. A feedback circuit according to claim 5, wherein said first capacitance is greater than said second capacitance.

7. A feedback circuit according to claim 1, wherein said MRI receiver antenna includes a coil having two ends, the voltage at each end being approximately equal in magnitude and opposite in polarity.

8. A feedback circuit according to claim 1, wherein the amplifying means includes a second output opposite in polarity to the output of said amplifying means, and the circuit further comprises:

second means for providing a second resistive feedback path from the second output of the amplifying means to the resonant circuit means, the second feedback path carrying second feedback current approximately 180° different in phase from said first feedback current; and wherein said capacitive current divider means further includes a second tap point, the second feedback path being connected to the second tap point, for diverting a first portion of said second feedback current away from said resonant circuit means and for directing a second portion of said second feedback current to said resonant circuit means.

9. A feedback circuit according to claim 8, wherein said amplifying means includes a double input, double output voltage amplifier having a differential input and a balanced output with respect to ground.

10. A feedback circuit according to claim 8, further comprising first switch means in said resistive feedback path for selectively interrupting said resistive feedback path and second switch means in said second resistive feedback path for selectively interrupting said second resistive feedback path.

11. A feedback circuit according to claim 1, further comprising:

second amplifying means, coupled to said resonant circuit means, for amplifying at least a fraction of said output voltages;

second means for providing a second feedback path from an output of said second amplifying means to said resonant circuit means, said second feedback path carrying second feedback current;

second capacitive current divider means having a tap point to which said second feedback path is connected, for diverting a first portion of said second feedback current away from said resonant circuit means and for directing a second portion of said second feedback current to said resonant circuit means; and differential amplifier means, connected to the outputs of said amplifying means and said second amplifying means, for obtaining a signal representing the difference of the outputs of said amplifying means and said second amplifying means.

12. A feedback circuit according to claim 11, further comprising first switch means in said resistive feedback path for selectively interrupting said resistive feedback path and second switch means in said second resistive feedback path for selectively interrupting said second resistive feedback path.

* * * * *